United States Patent
Tsang et al.

(10) Patent No.: US 8,680,915 B1
(45) Date of Patent: Mar. 25, 2014

(54) TECHNIQUES TO REDUCE MEMORY EFFECT OR INTER-SYMBOL INTERFERENCE (ISI) IN CIRCUITS USING OP-AMP SHARING

(75) Inventors: Cheongyuen Tsang, Union City, CA (US); Ken A. Nishimura, Fremont, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 50 days.

(21) Appl. No.: 13/306,019

(22) Filed: Nov. 29, 2011

(51) Int. Cl.
*H03F 1/02* (2006.01)
(52) U.S. Cl.
USPC .............................................................. 330/9

(58) Field of Classification Search
USPC ....................................................... 330/9, 253
See application file for complete search history.

(56) References Cited

U.S. PATENT DOCUMENTS

| | | | |
|---|---|---|---|
| 8,120,423 B2 * | 2/2012 | Deng et al. ........................ 330/9 |
| 2010/0045378 A1 | 2/2010 | Steele | |
| 2011/0148523 A1 | 6/2011 | Deng et al. | |

* cited by examiner

*Primary Examiner* — Steven J Mottola (57) ABSTRACT

An amplifier system and method that eliminates memory effects due to amplifier sharing. The amplifier has a plurality of input stages. An input to be amplified is applied to one of the input stages of the amplifier, while the other input stages are turned off and reset. The inputs of the unused input stages are thus reset and equalized while the other input stage is turned on to receive the input to be amplified. An explicit reset phase is not needed.

19 Claims, 7 Drawing Sheets

TECHNIQUES TO REDUCE MEMORY EFFECT OR INTER-SYMBOL INTERFERENCE (ISI) IN CIRCUITS USING OP-AMP SHARING

BACKGROUND

Operational amplifiers (op-amps) may be time-shared by different parts of a circuit, such as between pipelined analog to digital converter (ADC) stages or between different slices in time-interleaved ADCs. In such time-sharing op-amp schemes, a multiplexer provides the inputs from the different parts of the circuit to the shared op-amp. However, the internal circuit nodes of the multiplexer and the op-amp may have a memory of previous signals applied from shared parts of the circuit, resulting in cross-talk that degrades accuracy.

As a conventional approach for eliminating the memory effect, an explicit and separate reset phase may be added to the ADC non-overlapping clock scheme. During the reset phase, a neutral voltage such as a common mode voltage may be applied to the op-amp input. The op-amp is effectively idle during the reset phase, and the circuit nodes are brought back to a quiescent state to remove any memory of prior signals. However, to completely eliminate the memory effect, the reset phase must occupy a significant portion of the clock cycle. As a consequence, the reset phase significantly reduces the time available for op-amp settling for a given clock speed, resulting in increased power consumption or a lower sampling rate.

Therefore, there is a need for a method of reducing memory effect in circuits such as pipelined ADCs with op-amp sharing, that shortens or eliminates the explicit reset phase between different slices to improve sampling rate, and that eliminates inter-symbol interference between stages.

SUMMARY

In a representative embodiment, an amplifier system includes an amplifier having a plurality of input stages; a controller that generates clock signals; and a plurality of switch stages that are responsive to the clock signals, the plurality of switch stages being configured to: sample input signals and to turn off the input stages in a sampling mode; output a neutral voltage to the input stages in a recovery mode; and output sampled voltages to the input stages in an amplification mode, wherein when one of the switch stages is in the amplification mode, the other of the switch stages are in the sampling mode.

In a further representative embodiment, an amplifier system includes an amplifier having a plurality of input stages, each of the input stages including a differential transistor pair; a controller that outputs clock signals; and a plurality of switch stages that are responsive to the clock signals, the plurality of switch stages being configured to: sample input signals, and to turn off the differential transistor pairs and equalize the input terminals in a sampling mode; and output sampled voltages to the input stages in an amplification mode, wherein when one of the switch stages is in the amplification mode, the other of the switch stages are in the sampling mode.

In a still further representative embodiment, a method of sharing an amplifier that has a plurality of input stages, includes sampling input signals to provide sampled voltages; connecting a first voltage to input terminals of the input stages to turn off the input stages and equalize the input terminals during said sampling; connecting a neutral voltage to the input terminals of one of the input stages to bias the input terminals from the first voltage and turn on the input stage; and connecting a sampled voltage to the input stage after the input stage is turned on to amplify the sampled voltage, while all of the other input stages are shut off.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Figure 1:
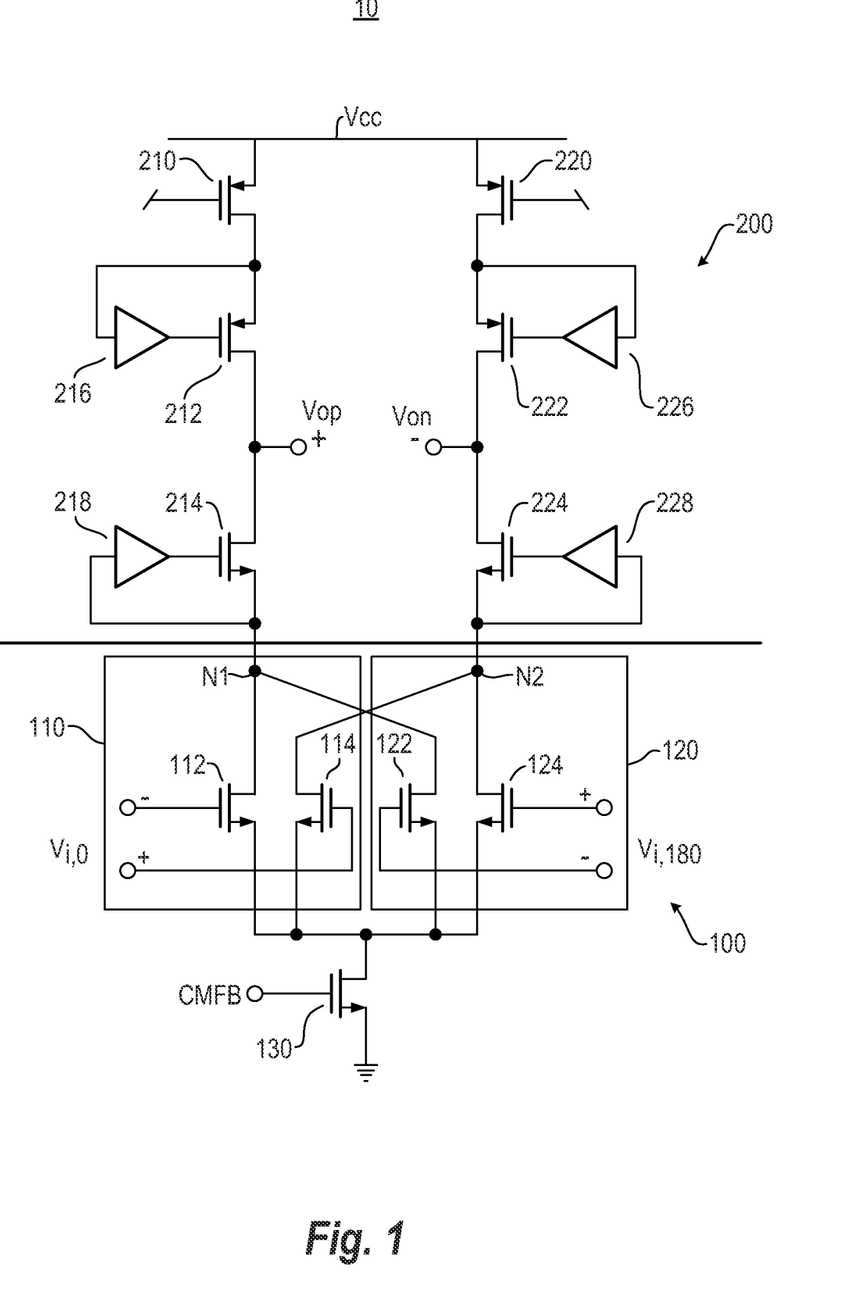
FIG. 1 is a schematic diagram illustrating a dual parallel input op-amp, according to a representative embodiment.

FIG. 1 is a schematic diagram illustrating a dual parallel input op-amp, which may be characterized as an amplifier system, according to a representative embodiment.

As shown in FIG. 1, op-amp 10 includes dual input stage 100 having a first input stage 110 and a second input stage 120. The first input stage 110 includes a first differential transistor pair having NMOS transistors 112 and 114 connected to first input terminals $V_{i,0}$. The second input stage 120 includes a second differential transistor pair having NMOS transistors 122 and 124 connected to second input terminals $V_{i,180}$. The first input stage 110 and the second input stage 120 normally operate 180° out of phase with respect to each other with input differential terminal signals at $V_{i,0}$ and $V_{i,180}$, respectively. As shown, NMOS transistor 112 of the first input stage 110 has a drain connected to node N1, and a source connected to the drain of NMOS transistor 130. NMOS transistor 114 of the first input stage 110 has a drain connected to node N2, and a source connected to the drain of NMOS transistor 130. Input terminals $V_{i,0}$ are respectively connected to the gates of NMOS transistors 112 and 114. NMOS transistor 122 of the second input stage 120 has a drain connected to node N1, and a source connected to the drain of NMOS transistor 130. NMOS transistor 124 of the second input stage 120 includes a drain connected to node N2, and a source connected to the drain of NMOS transistor 130. Input terminals $V_{i,180}$ are respectively connected to the gates of NMOS transistors 122 and 124. NMOS transistor 130 also includes a source connected to a ground voltage, and a gate connected to bias signal CMFB.

Amplifier stage 200 includes PMOS transistor 210, PMOS transistor 212 and NMOS transistor 214 connected serially between system voltage Vcc and node N1. PMOS transistor 210 has a source terminal connected to system voltage Vcc, a gate terminal connected to a bias signal, and a drain terminal connected to the source terminal of PMOS transistor 212 and to the input of amplifier 216. PMOS transistor 212 has the source terminal connected to an input of amplifier 216, a gate terminal connected to the output of amplifier 216, and a drain terminal connected to the positive output terminal Vop of amplifier stage 200. NMOS transistor 214 has a drain terminal connected to the positive output terminal Vop, a gate terminal connected to the output of amplifier 218, and a source terminal connected to the input of amplifier 218 and to node N1.

Amplifier stage 200 further includes PMOS transistor 220, PMOS transistor 222 and NMOS transistor 224 connected serially between system voltage Vcc and node N2. PMOS transistor 220 has a source terminal connected to system voltage Vcc, a gate terminal connected to a bias signal, and a drain terminal connected to the source terminal of PMOS transistor 222 and to the input of amplifier 226. PMOS transistor 222 has the source terminal connected to an input of amplifier 226, a gate terminal connected to the output of amplifier 226, and a drain terminal connected to the negative output terminal Von of amplifier stage 200. NMOS transistor 224 has a drain terminal connected to the negative output terminal Von, a gate terminal connected to the output of amplifier 228, and a source terminal connected to the input of amplifier 228 and to node N2. It should be understood however that amplifiers 216, 218, 226 and 228 serve to increase the DC gain of this representative amplifier stage 200, and are not central to the operation of dual input stage 100 in op-amp 10. That is, in a further representative embodiment, amplifiers 216, 218, 226 and 228 may be excluded, and the gates of PMOS transistors 212 and 222 may be connected to a second bias voltage and the gates of PMOS transistors 214 and 224 may be connected to a third bias voltage. The amplifier stage of this further representative embodiment would still be operable to demonstrate operation of the dual input stage 100.

Although op-amp 10 is described with respect to FIG. 1 as having dual input stage 100 including a first input stage 110 and a second input stage 120 with respective first and second differential transistor pairs, op-amps of other representative embodiments may have a plurality of input stages including more than two input stages each having a respective differential transistor pair connected to respective differential inputs that are provided non-overlapping in time. Moreover, although op-amp 10 as shown FIG. 1 is a telescopic amplifier, other representative embodiments may include other types of op-amps.

Op-amp 10 according to the representative embodiment of FIG. 1 thus has a first input stage 110 and a second input stage 120 respectively connected to multiple corresponding stages or slices. As will be described hereafter, each of first input stage 110 and second input stage 120 of op-amp 10 have connected thereto either a slice of the corresponding ADC circuit or a turn-off voltage that is operable to turn off the input stage. The turn-off voltage may be ground voltage, or a voltage other than ground voltage that turns off the input stages. Because NMOS transistors 112, 114, 122 and 124 form a structure with a common source terminal, the bias current from NMOS transistor 130 will preferentially flow in the NMOS transistor from among NMOS transistors 112, 114, 122 and 124 that has the highest gate voltage. Therefore, for example, first input stage 110 comprised of NMOS transistors 112 and 114 can be turned off by ensuring that the gate voltages of NMOS transistors 112 and 114 are below the gate voltages of the input stage which is active, for example second input stage 120 comprised of NMOS transistors 122 and 124, by a substantial amount. In the preceding example, the substantial amount is a difference in voltage which causes practically all of the bias current to flow in the device or devices constituting the active input stage, and practically none of the bias current to flow in the devices constituting the remaining inactive stages. For instance, in a typical CMOS circuit, the difference in voltage necessary to effect the aforementioned current division is approximately sqrt(2)*(Vgs−Vth), wherein the quantity (Vgs−Vth) is the gate voltage in excess of the device threshold required for a transistor to carry the bias current.

Figure 2:
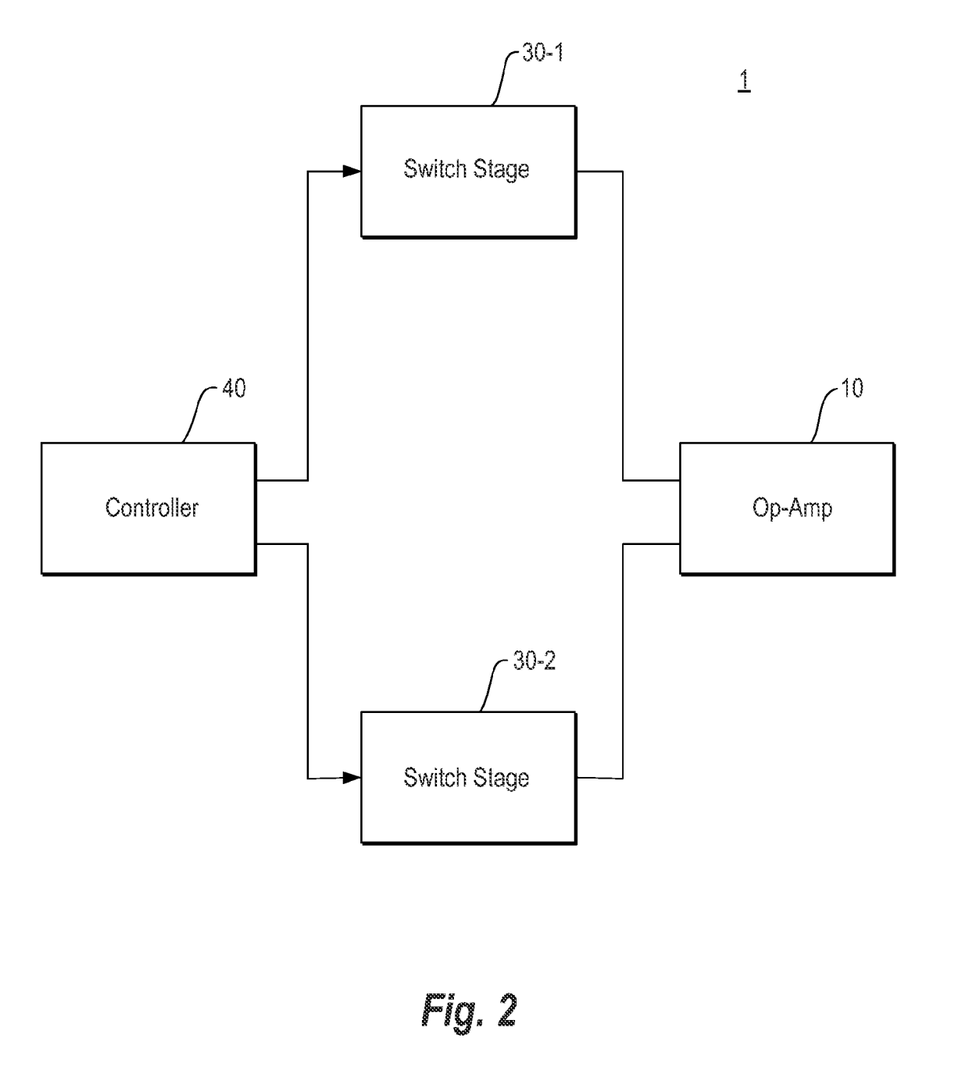
FIG. 2 is a block diagram illustrating a system including a dual parallel input op-amp 10 with switch stages and a controller, according to a representative embodiment.

FIG. 2 is a block diagram illustrating a system 1 including a dual parallel input op-amp with a plurality of switch stages and a controller, according to a representative embodiment.

In FIG. 2, op-amp 10 includes dual input stage 100 having first input stage 110 and second input stage 120 as shown in FIG. 1. Switch stage 30-1 as part of Channel A is connected to provide a sampled voltage and a turn-off voltage to input terminals $V_{i,0}$ of first input stage 110, and is also connected to receive the output of amplifier stage 200. Switch stage 30-2 as part of Channel B is connected to provide a sampled voltage and a turn-off voltage to input terminals $V_{i,180}$ of second input stage 120, and is also connected to receive the output of amplifier stage 200. Controller 40 provides clock signals as will be subsequently described, which control operation of switch stages 30-1 and 30-2.

Figure 3:
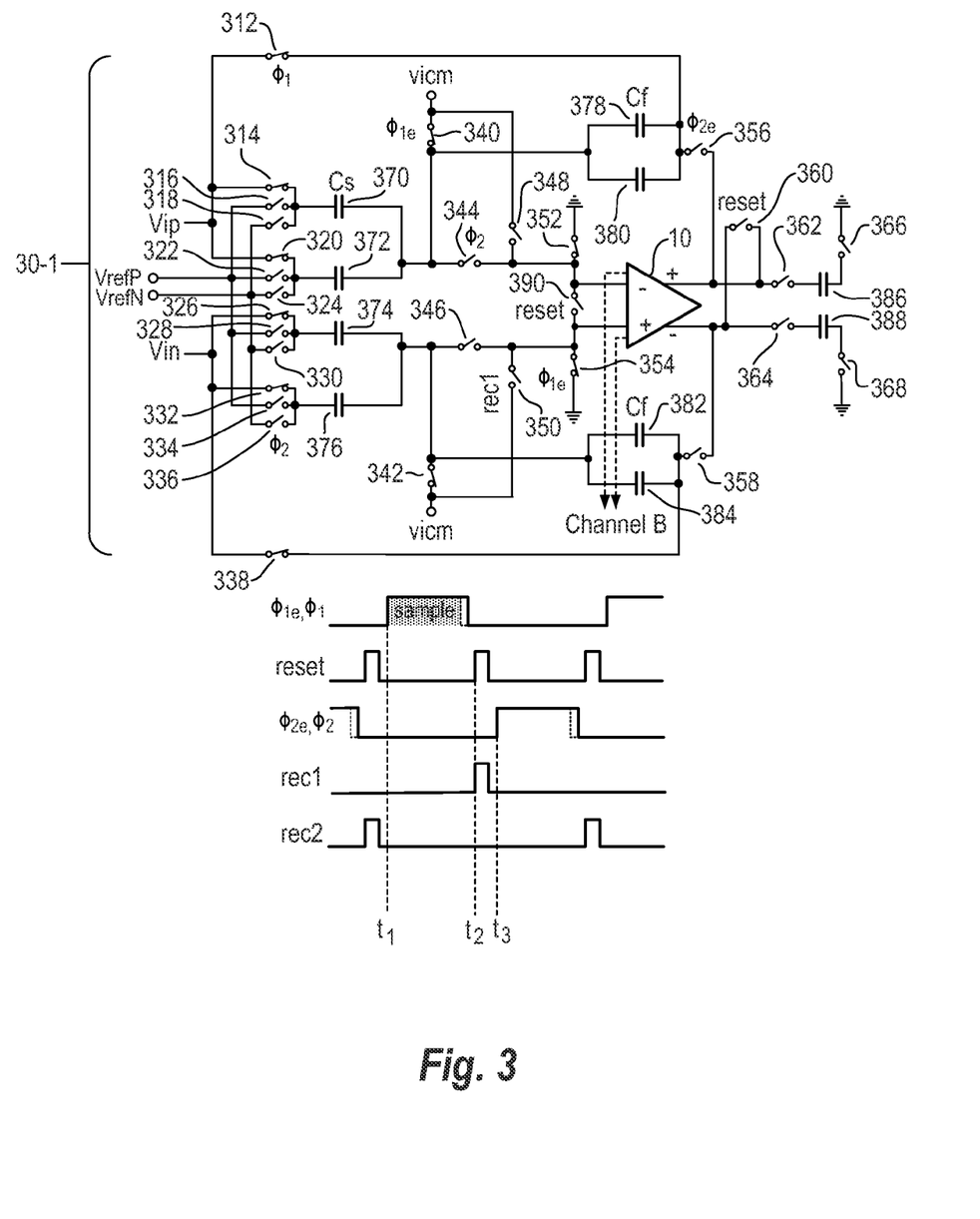
FIG. 3 is a schematic diagram illustrating a dual parallel input op-amp and a representative switch stage in a sampling mode of operation with clock signals, according to a representative embodiment.

FIG. 3 is a schematic diagram illustrating a dual parallel input op-amp and a representative switch stage in a sampling mode of operation with clock signals, according to a representative embodiment.

In FIG. 3, op-amp 10 is shown along with various switches and capacitors that constitute switch stage 30-1 connected to first input stage 110 of op-amp 10 as part of Channel A. Since switch stage 30-2 includes similarly configured switches and capacitors that are connected to second input stage 120 of op-amp 10 as part of Channel B, switch stage 30-2 is not shown in FIG. 3 and description thereof is omitted.

As shown in FIG. 3, differential analog input signal Vip is connected to first terminals of switches 312, 314 and 320, and differential analog input signal Vin is connected to first terminals of switches 326, 332 and 338. Reference voltage VrefP is connected to the first terminals of switches 316, 322, 328 and 334, and reference voltage VrefN is connected to the first terminals of switches 318, 324, 330 and 336. The second terminals of switches 314, 316 and 318 are connected to a first terminal of capacitor 370. The second terminals of switches 320, 322 and 324 are connected to a first terminal of capacitor 372. The second terminals of switches 326, 328 and 330 are connected to a first terminal of capacitor 374. Also, the second terminals of switches 332, 334 and 336 are connected to a first terminal of capacitor 376.

The second terminals of capacitors 370 and 372 are connected to the first terminals of switch 344, switch 340 and capacitors 378 and 380. The second terminal of switch 340 is connected to common mode voltage vicm. Practically, the common mode voltage vicm may be greater than or equal to the sum of Vds of NMOS transistor 130, plus (Vth+Vdsat) of NMOS transistors 112, 114, 122 and 124 with quiescent bias currents. That is, the common mode voltage vicm may be Vds+(Vth+Vdsat). Vdsat is Vgs−Vth of the transistor, and may be considered as the excess voltage above threshold required to bias the transistor to carry the desired current. The second terminals of capacitors 378 and 380 are connected to the second terminal of switch 312. A first terminal of switch 348 is connected to common mode voltage vicm. A first terminal of switch 352 is connected to ground voltage. The second terminals of switches 344, 348 and 352 are connected to the inverting input terminal of op-amp 10.

The second terminals of capacitors 374 and 376 are connected to the first terminals of switch 346, switch 342 and capacitors 382 and 384. The second terminal of switch 342 is connected to common mode voltage vicm. The second terminals of capacitors 382 and 384 are connected to the second terminal of switch 338. A first terminal of switch 350 is connected to common mode voltage vicm. A first terminal of switch 354 is connected to ground voltage. The second terminals of switches 346, 350 and 354 are connected to the non-inverting input terminal of op-amp 10. Also, a switch 390 has a first terminal connected to the second terminal of switch 352 and to the inverting input terminal of op-amp 10, and a second terminal connected to the second terminal of switch 354 and to the non-inverting input terminal of op-amp 10.

As further shown in FIG. 3, as part of a feedback configuration of op-amp 10, switch stage 30-1 further includes first terminals of switches 356 and 362 connected to non-inverting output terminal Vop of op-amp 10. A second terminal of switch 356 is connected to the second terminals of capacitors 378 and 380. A second terminal of switch 362 is connected to a first terminal of capacitor 386. Switch 366 has a first terminal connected to the second terminal of capacitor 386 and a second terminal connected to ground voltage. First terminals of switches 358 and 364 are connected to inverting output terminal Von of op-amp 10. A second terminal of switch 358 is connected to the second terminals of capacitors 382 and 384. A second terminal of switch 364 is connected to a first terminal of capacitor 388. Switch 368 has a first terminal connected to the second terminal of capacitor 388 and a second terminal connected to ground voltage. Also, switch 360 includes a first terminal connected to the inverting output terminal Von of op-amp 10 and a second terminal connected to the non-inverting output terminal Vop of op-amp 10.

During the sampling mode shown in FIG. 3, clock signals $\phi_1$ and $\phi_{1e}$ provided from controller 40 are driven to a logic high level at time t1. The dotted vertical line indicates that the falling edge of clock signal $\phi_{1e}$ occurs a short time before the falling edge of clock signal $\phi_1$. Switches 312, 314, 320, 326, 332, and 338 are turned on (closed) by clock signal $\phi_1$ provided from controller 40. Switches 340, 342, 352 and 354 are turned on by clock signal $\phi_{1e}$ provided from controller 40. All of the other switches are turned off (opened) by the corresponding clock signals provided from controller 40. The differential analog input signal pair Vip and Vin of the corresponding half-circuit are thus sampled in switch stage 30-1 by capacitors 370, 372, 374 and 376 which may be characterized as sampling capacitors and by capacitors 378, 380, 382 and 384 which may be characterized as feedback capacitors. Since switches 352 and 354 are turned on, ground voltage is connected to the inverting and non-inverting input terminals of op-amp 10 (input terminals $V_{i,0}$ of first input stage 110) during the sampling mode, to turn off NMOS transistors 112 and 114 of first input stage 110. The gates of NMOS transistors 112 and 114 are also both equalized to ground voltage. Accordingly, during the sampling mode, the first input stage 110 is reset and the gates of NMOS transistors 112 and 114 are equalized to ground, removing remnants of any voltages on the gates of NMOS transistors 112 and 114. The sampling mode of this representative embodiment may be about 40%-45% of the clock cycle, although in other representative embodiments the duration of the sampling mode may be different.

In the representative embodiment shown in FIG. 3, the first terminals of switches 352 and 354 are connected to ground, so that when switches 352 and 354 are turned on during the sampling mode, ground voltage is connected to the input terminals of op-amp 10 to turn off NMOS transistors 112 and 114 of first input stage 110. As described previously, the turn-off voltage may be a voltage other than ground. For example, if switches 352 and 354 are fabricated using NMOS transistors, the use of a voltage substantially below vicm as the turn-off voltage improves the effectiveness of the switches 352 and 354. A turn-off voltage substantially below vicm reduces the time necessary to ensure that the gates of NMOS transistors 112 and 114 are equalized to the same value and that remnants of any voltages on the gates of NMOS transistors 112 and 114 are removed. Accordingly, in a further representative embodiment, the first terminals of switches 352 and 354 of FIG. 3 may be connected to a voltage substantially below common mode voltage vicm instead of ground voltage.

As should be understood, the first input stage 110 and the second input stage 120 normally operate 180° out of phase with respect to each other with input terminals $V_{i,0}$ and $V_{i,180}$, respectively. Accordingly, while switch stage 30-1 operates responsive to the clock signals provided by controller 40 in the sampling mode to turn off first input stage 110 of op-amp 10, switch stage 30-2 operates responsive to the clock signals provided by controller 40 to operate in an amplification mode to provide the sampled voltage to second input stage 120 for amplification by amplifier stage 200 of op-amp 10. Operation of switch stage 30-1 in the amplification mode will be described later.

Figure 4:
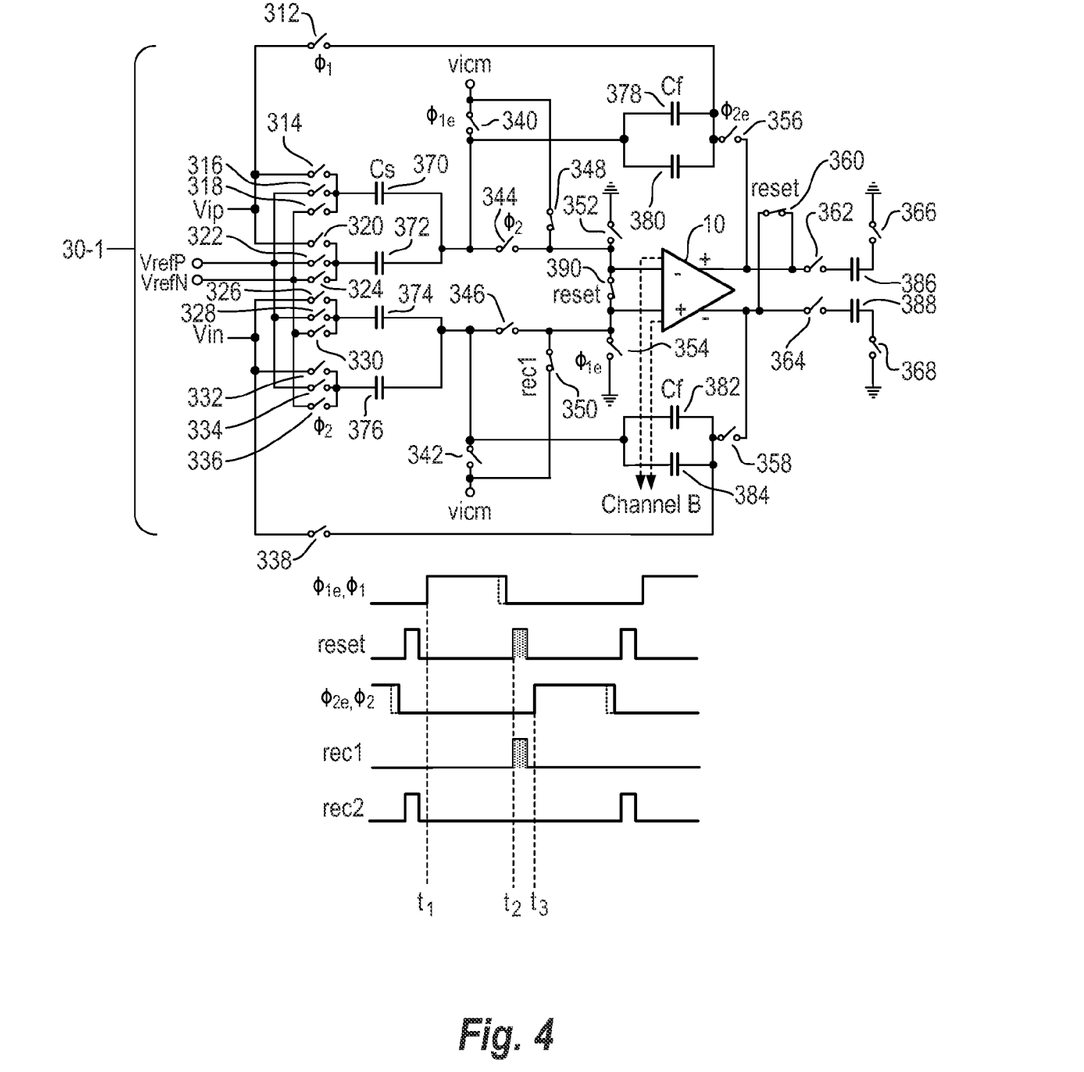
FIG. 4 is a schematic diagram illustrating a dual parallel input op-amp and a representative switch stage in a recovery mode of operation with clock signals, according to a representative embodiment.

FIG. 4 is a schematic diagram illustrating a dual parallel input op-amp and a representative switch stage in a recovery mode of operation with clock signals, according to a representative embodiment.

During the recovery mode as shown in FIG. 4, the reset clock signal and the rec1 clock signal provided from controller 40 are driven to a logic high level at time t2 following time t1. Switches 348 and 350 are turned on by the rec1 clock signal, and switches 360 and 390 are turned on by the reset clock signal. All of the other switches are turned off by the corresponding clock signals provided from controller 40. Accordingly, during the recovery mode, the common mode voltage vicm is connected by switch 390 to both the inverting and non-inverting terminals of op-amp 10, to equalize the input terminals of op-amp 10. The common mode voltage vicm is thus also connected to the input terminals $V_{i,0}$ of first input stage 110. Also, the gate terminals of NMOS transistors 112 and 114 of first input stage 110 can be charged from ground voltage to the common mode voltage vicm after the sampling mode, to activate NMOS transistors 112 and 114. Also, switch 360 connects the inverting and non-inverting output terminals of op-amp 10 together, to equalize the output terminals of op-amp 10 during the recovery mode. The recovery mode can be relatively short in comparison to the sampling and amplification modes, since it is not necessary to precisely charge the input terminals $V_{i,0}$ of first input stage 110 to common mode voltage vicm to activate NMOS transistors 112 and 114. During the recovery mode, input terminals $V_{i,180}$ of second input stage 120 may be grounded.

Figure 5:
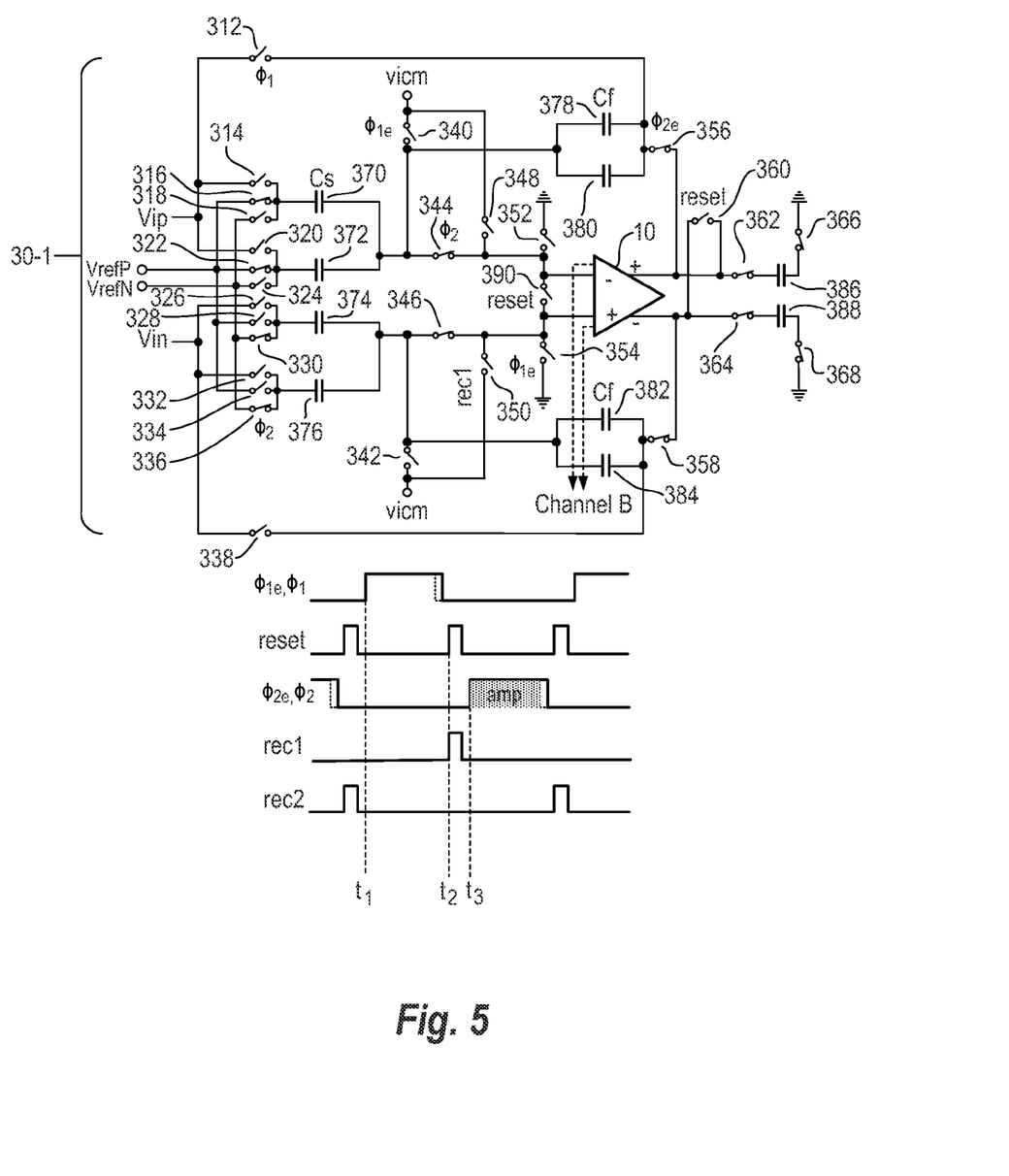
FIG. 5 is a schematic diagram illustrating a dual parallel input op-amp and a representative switch stage in an amplification mode of operation with clock signals, according to a representative embodiment.

FIG. 5 is a schematic diagram illustrating a dual parallel input op-amp and a representative switch stage in an amplification mode of operation with clock signals, according to a representative embodiment.

During the amplification mode as shown in FIG. 5, clock signals $\phi_2$ and $\phi_{2e}$ provided from controller 40 are driven to a logic high level at time t3. The dotted vertical line indicates that the falling edge of clock signal $\phi_{2e}$ occurs a short time before the falling edge of clock signal $\phi_2$. It should be understood that depending on the input differential voltage level (Vip–Vin), the first terminals of sampling capacitors 370, 372, 374 and 376 may be connected with switches 316-336 in various different configurations. FIG. 5 illustrates one possible connection configuration that is described to be explanatory of the representative embodiment. Various other connection configurations of sampling capacitors 370, 372, 374 and 376 with switches 316-336 should be within the understanding of ordinary skill, and are not described.

In FIG. 5, switches 316 and 322 are turned on by clock signal $\phi_2$ to respectively connect reference voltage VrefP to the first terminals of capacitors 370 and 372. Also, switches 330 and 336 are turned on by clock signal $\phi_2$ to respectively connect reference voltage VrefN to the first terminals of sampling capacitors 374 and 376. Switches 344 and 346 are turned on by clock signal $\phi_2$ to respectively connect the second terminals of capacitors 370 and 372 to the inverting input terminal of op-amp 10, and to connect the second terminals of capacitors 374 and 376 to the non-inverting input terminal of op-amp 10. Switches 356 and 358 are turned on by clock signal $\phi_{2e}$ to respectively connect the second terminals of capacitors 378 and 380 to the non-inverting output terminal of op-amp 10, and to connect the second terminals of capacitors 382 and 384 to the inverting output terminal of op-amp 10. Accordingly, during the amplification mode, the sampled voltage at the inverting and non-inverting input terminals of op-amp 10 are provided to the input terminals $V_{i,0}$ of first input stage 110. As a result, NMOS transistors 112 and 114 are turned on and amplifier stage 200 of op-amp 10 as shown in FIG. 1 operates to provide an amplified signal to output terminals Vop and Von responsive to the sampled voltage connected to the inverting and non-inverting input terminals of op-amp 10.

Since the respective differential input signals are provided to first and second input stages 110 and 120 180° out of phase with respect to each other, while switch stage 30-1 operates responsive to the clock signals provided by controller 40 in the amplification mode as shown in FIG. 5, switch stage 30-2 operates responsive to the clock signals provided by controller 40 to operate in the sampling mode as shown in FIG. 3 to turn off second input stage 120 of op-amp 10.

As a result, rather than resetting op-amp 10 by applying a neutral voltage during an explicit or separate reset phase as in the conventional approach, the turn-off voltage is applied to turn off and reset a corresponding non-used first input stage 110 or non-used second input stage 120, while the other input stage is operable in an amplification mode. A clock scheme having an explicit or separate reset phase between amplification phases is thus unnecessary. In the case of op-amp 10 having two input stages including first and second input stages 110 and 120, the non-used input stage may be reset during an entire half period of the clock. The resetting period of first and second input stages 110 and 120 is therefore much longer than the aforementioned explicit reset phase of the conventional approach. The reset period of first and second input stages 110 and 120 of the representative embodiment may thus be 40%-45% of the clock period. In contrast, the explicit reset phase of the conventional approach is typically 10%-15% of the clock period. Moreover, first input stage 110 and second input stage 120 may be reset to ground voltage, which is more efficient than the conventional approach which merely resets the op-amp using a neutral voltage that does not turn off the op-amp. In particular, in the representative embodiment, the gates of the differential transistor pair of the non-used input stage are pulled to ground for example, to turn off the differential transistor pair and remove remnants of any voltages at the gates of the differential transistor pair. This also forces all bias current to the differential transistor pair operable in the amplification mode, so that all of the bias current may be fully and efficiently utilized.

Figure 6:
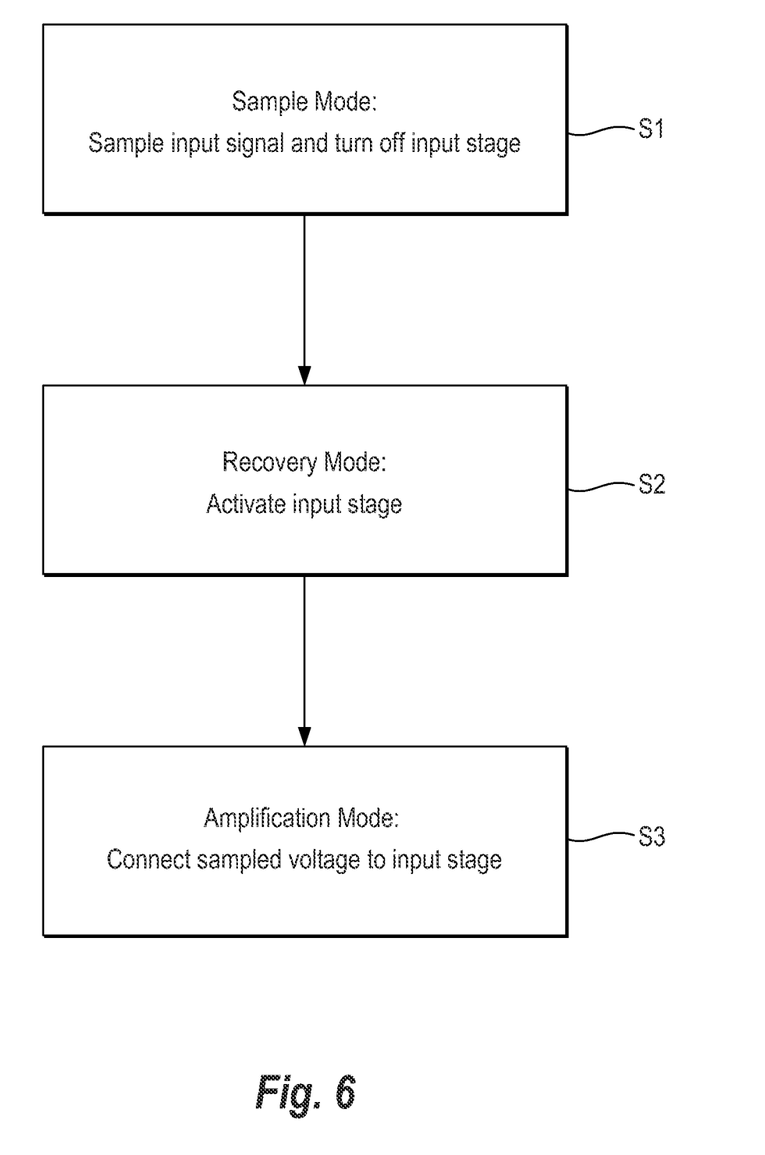
FIG. 6 is a flow chart illustrating a sequence of operating modes of the system shown in FIG. 1, according to a representative embodiment.

FIG. 6 is a flow chart illustrating a sequence of operating modes of the system shown in FIG. 2, according to a representative embodiment.

In the following, the sequence of operation of switch stage 30-1 shown in FIG. 2 is described with reference to the flow chart illustrated in FIG. 6. In S1, the switches of switch stage 30-1 are controlled by the clock signals from controller 40 in a sampling mode as previously described to acquire and sample an input signal in the capacitors. At the same time, switch stage 30-1 connects a first voltage to the input of op-amp 10 to turn off first input stage 110. The first voltage may be ground or a turn off voltage. Thereafter at S2, the switches of switch stage 30-1 are controlled by the clock signals in a recovery mode to connect a neutral voltage to the input of op-amp 10, to activate first input stage 110. The neutral voltage may be a common mode voltage. Thereafter at S3, the switches of switch stage 30-1 are controlled by the clock signals in an amplification mode to connect the sampled voltage from the capacitors to the input of op-amp 10, to provide the sampled voltage to first input stage 110 for amplification by amplifier stage 200 of op-amp 10. While switch stage 30-1 is in the sampling mode at S1, switch stage 30-2 is in the amplification mode to provide a sampled voltage to second input stage 120 of op-amp 10. Also, when switch stage 30-1 is in the amplification mode at S3, switch stage 30-2 is in the sampling mode to sample an input signal and turn off second input stage 120 of op-amp 10.

Accordingly, during a first phase of operation corresponding to S1 of FIG. 6, a first sampled voltage is connected to second input stage 120 as a first input stage, while first input stage 110 as a second input stage is turned off. In a second phase of operation corresponding to S3 that follows the first phase, a second sampled voltage is connected to first input stage 110 while second input stage 120 is turned off. The first and second sampled voltages are thus sequentially applied to op-amp 10 for amplification. These operations at S1 through S3 are sequentially repeated for subsequent input signals.

Figure 7:
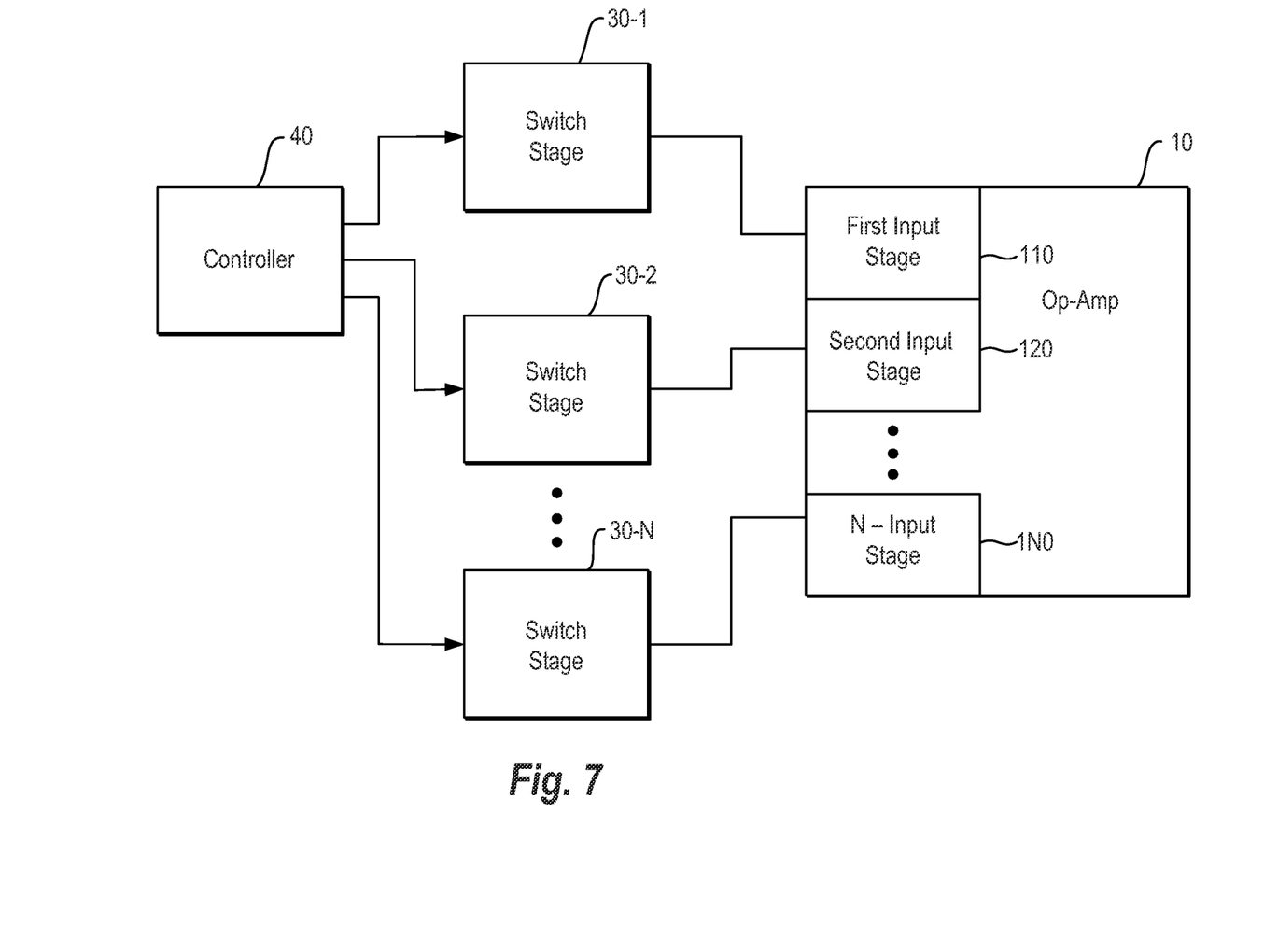
FIG. 7 is a block diagram illustrating an N-phase system including N switch stages, a controller and op-amp 10 having N input stages, according to a representative embodiment.

While specific embodiments are disclosed herein, many variations are possible, which remain within the concept and scope of the present teachings. For example, in a further representative embodiment, switch stages 30-1 and 30-2 transition directly from operation in a sampling mode to operation in an amplification mode, without an intervening recovery mode. The charge necessary to bring the gates of NMOS transistors 112, 114, 122 and 124 of first and second input stages 110 and 120 of op-amp 10 to the normal operating voltage is provided from the sampled voltages at the start of the amplification mode. However, since activation of the transistors is delayed slightly, a pedestal may occur at the output of the op-amp 10.

in the representative embodiments, the op-amp is described as a dual parallel input op-amp that operates as a two-phase system. As would be apparent to one of ordinary skill, the concepts of the representative embodiments can be applied to an N-phase system having controller 40, and N switch stages 30-1, 30-2, . . . 30-N connected to an op-amp 10 having N respective input stages 110, 120 and 1N0, wherein N is an integer greater than two, as shown in FIG. 7.

Also, in the representative embodiments, a multiplying digital to analog converter (MDAC) as shown in FIGS. 3-5 is described, for operation with ADC stages for example. As would be apparent to one of ordinary skill, the amplifier sharing concepts should not be limited to the embodiments shown, but may be used in any systems having multi-channel signals that are processed in parallel, such as audio and stereo systems for example. Also, the switch stages as shown in FIGS. 3-5 may be configured differently. Also, the concepts should not be limited to op-amps having differential transistor pair input stages, but may also be applicable to amplifiers having input stages of different configuration. In a still further representative embodiment, as would be apparent to one with ordinary skill, the concept can be applied to types of op-amp with PMOS input transistors. Such variations would be apparent in view of the specification, drawings and claims herein.

What is claimed is:

1. An amplifier system comprising:
   an amplifier having a plurality of input stages;
   a controller that generates clock signals; and
   a plurality of switch stages that are responsive to the clock signals, the plurality of switch stages being configured to: sample input signals and to turn off the input stages in a sampling mode; output a neutral voltage to the input stages in a recovery mode; and output sampled voltages to the input stages in an amplification mode, wherein when one of the switch stages is in the amplification mode, the other of the switch stages are in the sampling mode,
   wherein the switch stages output a ground voltage to turn off the input stages during the sampling mode.

2. The amplifier system of claim 1, wherein each of the input stages includes a differential transistor pair, and the voltages from the switch stages are connected to input terminals of the differential transistor pairs.

3. The amplifier system of claim 2, wherein the neutral voltage is a common mode voltage that biases the input terminals to turn the differential transistor pairs on.

4. The amplifier system of claim 1, wherein the ground voltage is additionally operable to equalize the input terminals during the sampling mode.

5. The amplifier system of claim 1, wherein the controller outputs the clock signals so that a first of the switch stages is in the amplification mode during a first phase, and a second of the switch stages is in the amplification mode during a second phase following the first phase.

6. The amplifier system of claim 1, comprising more than two input stages and more than two switch stages.

7. The amplifier system of claim 1, wherein the amplifier is a telescopic operational amplifier.

8. An amplifier system comprising:
   an amplifier having a plurality of input stages, each of the input stages including a differential transistor pair;
   a controller that outputs clock signals; and
   a plurality of switch stages that are responsive to the clock signals, the plurality of switch stages being configured to: sample input signals, and to turn off the differential transistor pairs and equalize the input terminals in a sampling mode; and output sampled voltages to the input stages in an amplification mode, wherein when one of the switch stages is in the amplification mode, the other of the switch stages are in the sampling mode,
   wherein the switch stages are also responsive to the clock signals to output a neutral voltage that biases the input terminals to turn the differential transistor pairs on in a recovery mode.

9. The amplifier system of claim 8, wherein the neutral voltage is a common mode voltage.

10. An amplifier system comprising:
    an amplifier having a plurality of input stages, each of the input stages including a differential transistor pair;
    a controller that outputs clock signals; and
    a plurality of switch stages that are responsive to the clock signals, the plurality of switch stages being configured to: sample input signals, and to turn off the differential transistor pairs and equalize the input terminals in a sampling mode; and output sampled voltages to the input stages in an amplification mode, wherein when one of the switch stages is in the amplification mode, the other of the switch stages are in the sampling mode,
    wherein the switch stages output a ground voltage to turn off the differential transistors during the sampling mode.

11. The amplifier system of claim 10, wherein the controller outputs the clock signals so that a first of the switch stages is in the amplification mode during a first phase, and a second of the switch stages is in the amplification mode during a second phase following the first phase.

12. The amplifier system of claim 10, comprising more than two input stages and more than two switch stages.

13. The amplifier system of claim 10, wherein the amplifier is a telescopic operational amplifier.

14. A method of sharing an amplifier that has a plurality of input stages, the method comprising:
    sampling input signals to provide sampled voltages;
    connecting a first voltage to input terminals of the input stages to turn off the input stages and equalize the input terminals during said sampling;
    connecting a neutral voltage to the input terminals of one of the input stages to bias the input terminals from the first voltage and turn on the input stage; and
    connecting a sampled voltage to the input stage after the input stage is turned on to amplify the sampled voltage, while all of the other input stages are shut off.

15. The method of claim 14, wherein a first sampled voltage is connected to a first input stage during a first phase, and a second sampled voltage is connected to a second input stage during a second phase following the first phase.

16. The method of claim 14, wherein each of the input stages includes a differential transistor pair, and the voltages are connected to input terminals of the differential transistor pairs.

17. The method of claim 14, wherein the neutral voltage is a common mode voltage.

18. The method of claim 14, wherein the amplifier includes more than two input stages.

19. The method of claim 14, wherein the first voltage is ground voltage.

* * * * *